United States Patent [19]
Blose et al.

[11] Patent Number: 5,397,980
[45] Date of Patent: Mar. 14, 1995

[54] CURRENT PROBE CALIBRATION FIXTURE

[75] Inventors: Kerry A. Blose, Glendale; Leon Henry, Maricopa, both of Ariz.

[73] Assignee: Honeywell Inc., Minneapolis, Minn.

[21] Appl. No.: 186,964

[22] Filed: Jan. 27, 1994

[51] Int. Cl.⁶ .............................................. G01R 17/06
[52] U.S. Cl. ........................................ 324/74; 324/601
[58] Field of Search ..................... 324/158 F, 74, 601, 324/750, 95, 127

[56] References Cited

U.S. PATENT DOCUMENTS 4,574,235  3/1986  Kelly et al. ...................... 324/158 F

OTHER PUBLICATIONS

Title—Environmental Conditions and Test Procedures for Airborne Equipment Author—Radio Technical Commission for Aeronautics Issue Date—Dec. 4, 1989.

*Primary Examiner*—Kenneth A. Wieder
*Assistant Examiner*—Mark Wardas
*Attorney, Agent, or Firm*—Charles J. Ungemach

[57] ABSTRACT

A current probe calibration fixture in which a pair of conductors of constant dimensions are constructed to surround the coils of the probe and to be spaced from the conductive shield around the coils by a dielectric of constant dimensions so as to assure a uniform desired impedance between the two conductors and minimize excessive currents.

10 Claims, 2 Drawing Sheets

CURRENT PROBE CALIBRATION FIXTURE

BACKGROUND OF THE INVENTION

1. Field of the Invention

The present invention relates to calibration fixtures and more particularly to a calibration fixture used in calibrating a current probe.

2. Description of the Prior Art

Current probes are used to apply magnetic fields to a conductor or conductors which exist between electrical components being tested. This is to simulate the magnetic fields which might be encountered when the equipment is subjected to an RF energy environment in actual use. For example, aircraft components may be subjected to large RF energy fields when they pass through radio, television or radar transmissions. The government has set up certain environmental conditions which manufacturers must use to test equipment being sold. One of such conditions may be that the equipment must operate satisfactorily in RF fields which generate no more than one amp of current in the conductors joining two electronic components. The governmental conditions may be expressed in a requirement that when exposed to RF energy in a range between two frequencies, a current of no more than predetermined magnitude will be induced in a conductor of predetermined impedance. One example of the required conditions is found in a document "RTCA/DO-160C ENVIRONMENTAL CONDITIONS AND TEST PROCEDURES FOR AIRBORNE EQUIPMENT". The requirements here are that no more than 300 milliamps be induced in a 50 ohm conductor over a 10 kHz to 400 MHz range. In order to assure that equipment is tested under these conditions, it is necessary to have a device that causes the current induction over the desired range. A current probe consisting of conductive coils enclosed in an e field shield or Faraday shield (a metal housing to contain the fields generated and shaped to surround the conductor or conductors) has been used for this purpose but it is necessary to make sure that the current probe is itself properly calibrated in order to know how much current it will induce at various frequencies. In the prior art, this has been done with a fixture which includes a central conductor passing through the center of the probe and an RF generator to supply the surrounding coils of the probe with varying amounts of energy at various frequencies and to induce a current in the conductor. In the example of the aircraft equipment above, the coils of the current probe would be supplied with power from an RF power generator and amplifier at frequencies from 10 kHz to 400 MHz at levels necessary to induce no more than 300 milliamps of current. Calibration fixtures available in the prior art comprise a fixture which holds a conductor in the central opening of the probe. The external connectors to the conductor are designed to be of 50 ohm impedance but the center conductor is not. As a result, the fixture surrounding the probe coacts with the probe and the center conductor to produce impedances which were very low at certain frequencies and this produces excessive currents. In some cases, using the prior art test fixtures, we have encountered currents high enough to destroy the equipment.

SUMMARY OF THE INVENTION

So as to prevent excessive currents, we have discovered that it is necessary to maintain a matching impedance (50 ohm in the present case) in the center conductor of the test fixture. We have also discovered that the matching impedance can be produced using microstrip transmission line theory which states that conductors of constant dimensions, when separated from a ground plane by a dielectric of constant dimensions, maintain a specific impedance along the entire length of the transmission line. Using this theory, we have designed a current probe calibrator which is formed of two conductors shaped to closely surround the e-field shield of the current probe. The dielectric between the conductors and the e-field shield is of constant dimension and chosen to produce the desired impedance (50 ohms in the example). A more complete understanding of the present invention will be had upon a reading of the following specification and claims taken in connection with the drawings.

DETAILED DESCRIPTION OF THE PREFERRED EMBODIMENTS

Figure 1:
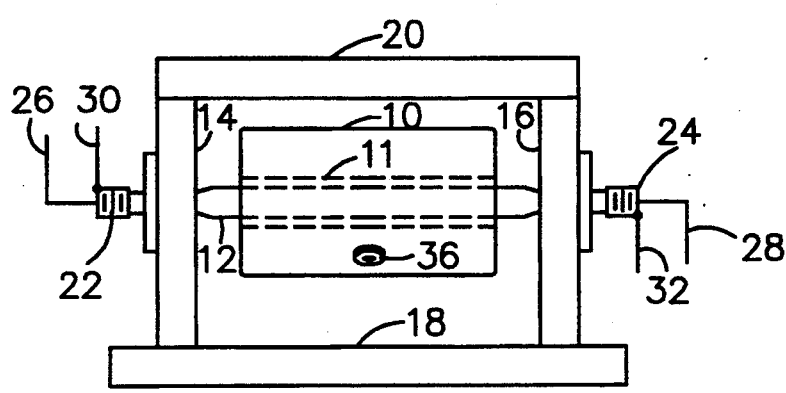
FIG. 1 shows a side view of a prior art current probe and calibration fixture.

FIG. 1 shows a prior art calibration fixture comprising a cylindrical current probe 10, such as obtainable from the Eaton Corporation, Electronic Instrumentation Division in Los Angeles, Calif. Probe 10 has a central opening shown by dashed line 11 and mounted to surround a center conductor 12. Center conductor 12 is fastened between two upright conductors 14 and 16 mounted between a conducting base 18 and an upper horizontal conductor 20. The center conductor 12 is connected at it ends through upright members 14 and 16 by connectors 22 and 24 to conductors 26 and 28. The conductive members 14, 16, 18 and 20 are connected to conductors 30 and 32. As will be seen in connection with FIG. 4, the probe 10 has a connector 36 which may be connected to a RF generator to supply the power to the coils therein and conductors 26 and 30 may be connected to an RF load while conductors 28 and 32 may be connected to a power meter or spectrum analyzer to measure the current and frequency generated in the center conductor 12. As the RF generator supplies power to the probe 10 at various frequencies, the spectrum analyzer records the current generated to calibrate the probe.

Because the impedance of the center conductor taken with the current probe 10 and the conductors 14, 16, 18 and 20 is not controlled to match the impedance of the other components, low impedances may been encountered at some frequencies resulting in higher than desired currents being induced.

Figure 2:
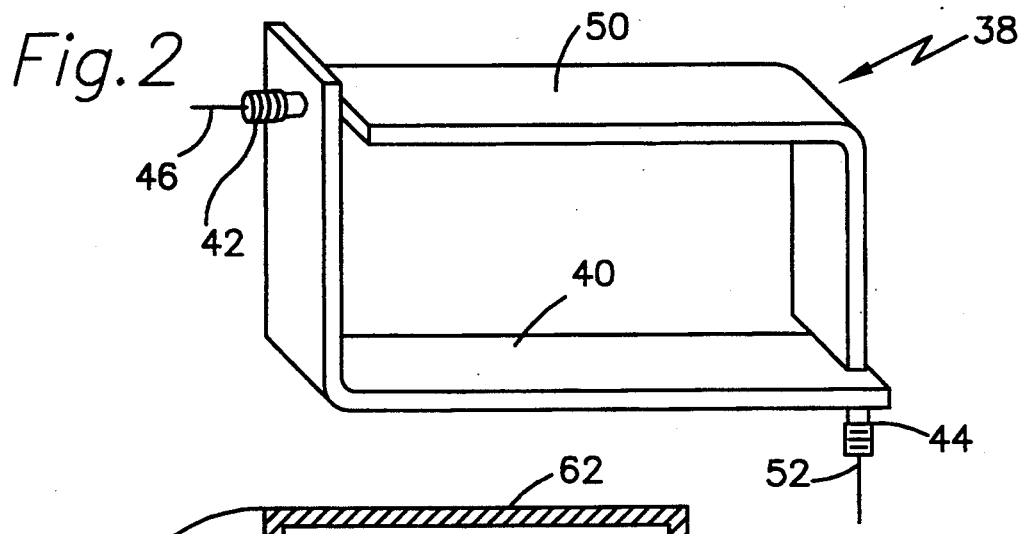
FIG. 2 shows the current probe calibration fixture of the present invention.

FIG. 2 shows one preferred embodiment of a calibration fixture 38 of the present invention. In FIG. 2, Fixture 38 is shown having a first "L" shaped conductor 40 with the upper end mounting a first connector 42 and the lower end mounting a second conductor 44. Connectors 42 and 44 are like connectors 22 and 24 of FIG. 1 and have a fixed impedance (50 ohms in the present example). A first wire conductor 46 passes through connector 42 and is fastened to the upper end of a second "L" shaped conductor 50. A second wire conductor 52 passes through connector 44 and is fastened to the lower end of conductor 50. The space between the conductors 40 and 50 at both ends has been exaggerated for clarity and in actual practice will be much less than shown. The two "L" shaped conductors 40 and 50 form a rectangular shape sized to fit around the exterior crossection of a current probe (FIG. 3).

Figure 3:
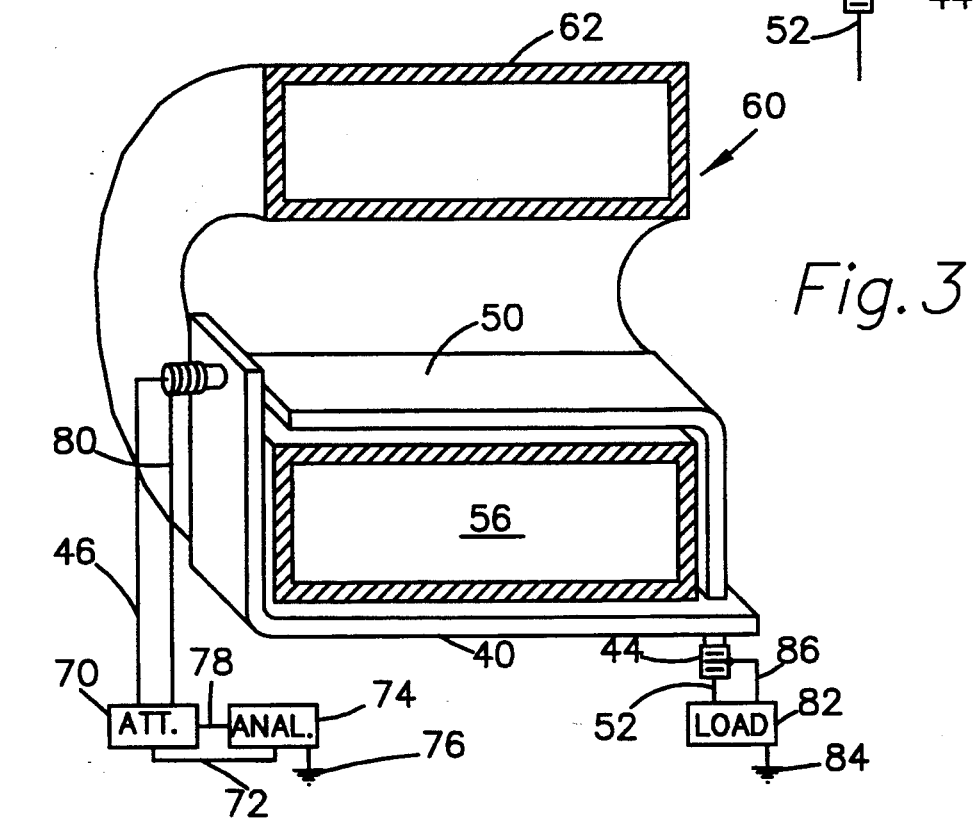
FIG. 3 is a crossectional view of a current probe with the calibration fixture of the present invention mounted thereon.
Figure 3A:
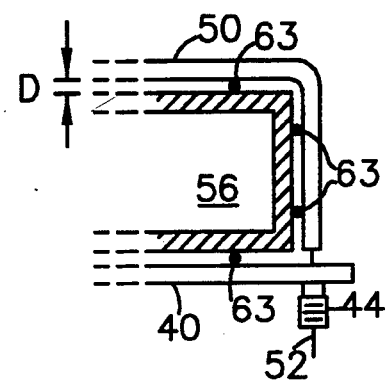
FIG. 3a is a close up view of a portion of the probe and calibration fixture of FIG. 3.

As seen in FIG. 3, The calibration fixture 38 is seen fastened around the lower section of coils 56 of a current probe 60 (shown in crossection). The coils 56 are surrounded by an e field shield 62 and the "L" shaped arms 40 and 50 surround the e field shield but are separated therefrom by a predetermined distance "D". (See FIG. 3a). The distance "D" may be filled with air or other dielectric material and this dielectric constant and the width and thickness of conductors 50 is chosen so that the impedance between members 40 and 50 of the fixture is a constant predetermined amount (50 ohms in the example). More particularly, if air is the dielectric, the thickness of the conductor 50 is 0.40 inches and the distance "D" is 0.06 inches, the width of member 50 will be 0.318 inches to produce a 50 ohm impedance between conductors 40 and 50. (With air as the dielectric, the spacing "D" will need to be maintained by spacers such as shown by reference numerals 63 in FIG. 3a but these spacers have been found to have little effect on the impedance). The width of conductor 40 may be the same or larger than the width of conductor 50. The important point is that conductor 50 has constant dimensions and is separated from conductor 40 (ground) by a dielectric of constant dimensions so that, in accordance with the microstrip transmission line theory, the impedance will remain constant. One might consider conductors 40 and 50 in FIG. 3 to be pressed together to form two flat strips one on top of the other but separated by a distance 2D in order to determine the impedance between them.

Conductor 50 is shown in FIG. 3 connected through the connector 42 by the wire 46 leading to an attenuator 70. Attenuator 70 is connected by a wire 72 to a spectrum analyzer 74. The housing of spectrum analyzer 74 is connected to ground at 76 and by a wire 78 to the housing of attenuator 70 and by a wire 80 through the connector 42 to the conductor 40 of the fixture 38. At the other end, conductor 50 is connected through connector 44 by wire 52 leading to a load 82 which has its housing connected to ground a 84 and by a wire 86 through the connector 44 to the conductor 40 of fixture 38. A source of RF energy (not shown in FIG. 3) may be connected to the coils 56 of the probe 60 and a current is thus induced in conductor 50 which is measured by the analyzer 74 to calibrate the probe 60. Because the fixture has been designed with the conductor 50 of constant dimensions and separated by a fixed distance "D" from the ground conductor 40 by a dielectric of constant dimensions, the impedance is controlled and we have been able to calibrate the probe without encountering any excessive currents.

Figure 4:
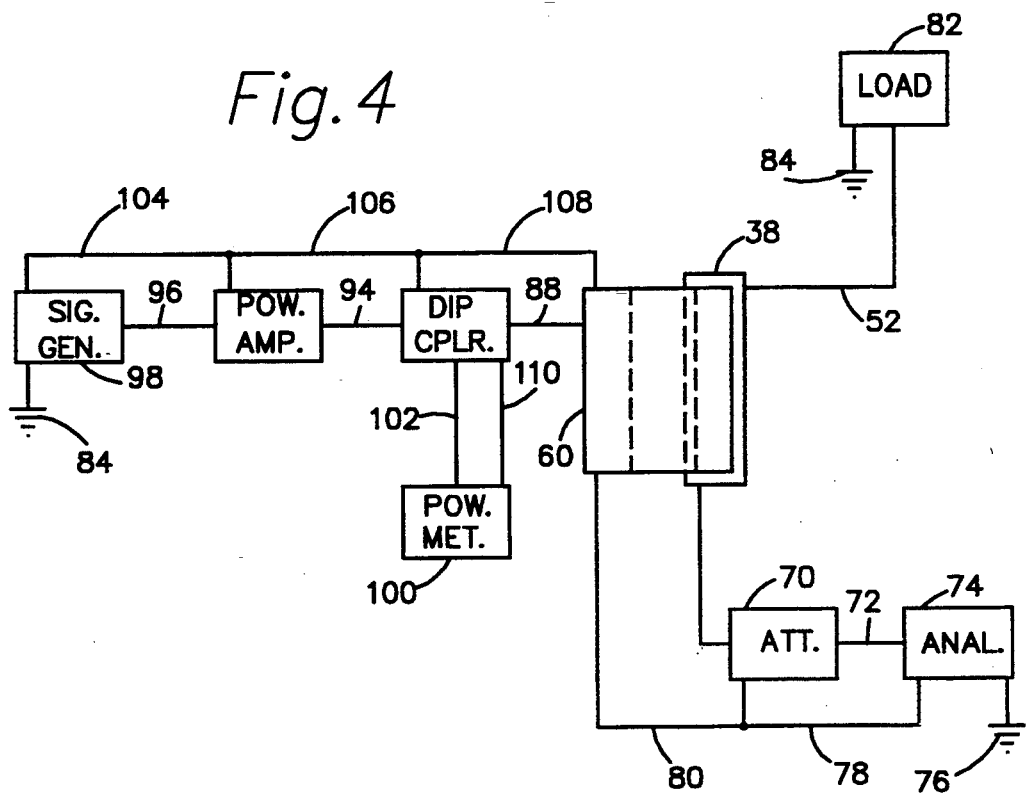
FIG. 4 is a schematic drawing of the current probe and calibration fixture of the present invention connected in a circuit for calibration.

FIG. 4 shows the current probe 60 with the fixture 38 connected in a circuit for calibration. The fixture 38 is shown like in FIG. 3 connected at one end by a conductor 46 to an attenuator 70 which is, in turn, connected by a conductor 72 to the spectrum analyzer 74 and, at the other end, by a conductor 52 to a load 82. As in FIG. 3, the housings are connected to ground 76 and 84 by conductors 78, 80 and 86. The probe 60 is also connected by a conductor 88 to a directional coupler 90 which receives RF power from a power amplifier 92 via a conductor 94. Power amplifier 92 is connected by a conductor 96 to a signal generator 98. Signal generator 98 and power amplifier produce the desired RF power at the desired frequency through the directional coupler 90 to the current probe 60 for calibration. Directional coupler 90 is also shown connected to a power meter 100 by a conductor 102 and operates to monitor the power supplied to the probe 60 t prevent excess current thereto. The housings of signal generator 98, power amplifier 92, directional coupler 90, probe 60 and power meter 100 are connected to ground 84 by conductors 104, 106, 108 and 110 respectively.

It is therefore seen that we have provided and improved current probe calibrator which operates by virtue of controlling the impedance of the fixture and the central conductor without producing excessive current throughout a large range of frequencies. Many modifications will occur to those skilled in the art. For example, the fixture instead of being formed by two "L" shaped members, could be two "U" shaped members or a straight member and a "U" shaped member to form the rectangle to surround the probe. Also, the shape need not necessarily be rectangular so long as the shape conforms to the exterior crossectional shape of the probe with the required constant spacing therefrom. I therefore do not wish to be limited to the specific descriptions used in connection with preferred embodiment and intend to be limited only by the following claims.

We claim:

1. Apparatus for use in calibrating a current probe having an e field shield comprising:
   a first conductor having constant dimensions between first and second points along its length;
   a second conductor connected to but insulated from the first conductor between the first and second points, the first and second conductors shaped to closely surround the e field shield of the current probe; and
   means spacing the first and second conductors from the e field shield of the probe by an amount sufficient to provide a dielectric of constant dimensions therebetween, the dielectric being chosen to provide a predetermined impedance between the first and second conductors.

2. The apparatus of claim 1 further including power generating means connected to supply power to the current probe to induce a current in the first conductor.

3. The apparatus of claim 2 further including current measuring means connected to the first point of said first conductor to measure the current flowing therethrough.

4. The apparatus according to claim 3 further including load means connected to the second point of said first conductor.

5. The apparatus of claim 4 further including a power amplifier and a directional coupler connected between the power generating means and the current probe, and including a power meter connected to the directional coupler to monitor the current being provided to the current probe.

6. The apparatus of claim 5 further including first and second connectors connected to the first and second points of the first conductor and to the current measuring device and the load, said first and second connectors having the predetermined impedance.

7. The apparatus of claim 1 wherein the first and second conductors are joined to form a rectangle.

8. The apparatus of claim 7 wherein the first and second conductors are "L" shaped.

9. Apparatus according to claim 6 wherein a first connector having the predetermined impedance is connected to the first point and a second connector having the predetermined impedance is connected to the second point.

10. Apparatus according to claim 9 wherein the first and second connectors are mounted on the second conductor to provide an electrical path for the first conductor through the second conductor.

* * * * *